(12) United States Patent
Denison et al.

(10) Patent No.: US 8,754,497 B2
(45) Date of Patent: Jun. 17, 2014

(54) STRAINED LDMOS AND DEMOS

(75) Inventors: Marie Denison, Plano, TX (US);
Seetharaman Sridhar, Richardson, TX (US); Sameer Pendharkar, Allen, TX (US); Umamaheswari Aghoram, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 166 days.

(21) Appl. No.: 12/789,040

(22) Filed: May 27, 2010

(65) Prior Publication Data
US 2010/0314670 A1 Dec. 16, 2010

Related U.S. Application Data

(60) Provisional application No. 61/181,465, filed on May 27, 2009.

(51) Int. Cl.
*H01L 29/66* (2006.01)
*H01L 29/78* (2006.01)
*H01L 29/06* (2006.01)

(52) U.S. Cl.
CPC ........ *H01L 29/7835* (2013.01); *H01L 29/7846* (2013.01); *H01L 29/0653* (2013.01)
USPC .................. 257/492; 257/E29.256

(58) Field of Classification Search
CPC ............ H01L 29/7835; H01L 29/7846; H01L 29/0653
USPC .................. 257/492, 493, E29.256
See application file for complete search history.

(56) References Cited

U.S. PATENT DOCUMENTS

| | | | |
|---|---|---|---|
| 5,294,824 A * | 3/1994 | Okada ............................ | 257/409 |
| 2005/0227476 A1* | 10/2005 | Inoue ............................. | 438/618 |
| 2006/0063320 A1* | 3/2006 | Orlowski et al. .............. | 438/199 |
| 2007/0080399 A1* | 4/2007 | Takaishi ........................ | 257/341 |
| 2007/0187781 A1* | 8/2007 | Kocon ........................... | 257/408 |
| 2008/0023760 A1* | 1/2008 | Ito et al. ........................ | 257/335 |
| 2008/0142852 A1* | 6/2008 | Doris et al. ................... | 257/255 |
| 2008/0190207 A1* | 8/2008 | Yang .............................. | 73/708 |
| 2009/0111238 A1* | 4/2009 | Kim ............................... | 438/425 |
| 2009/0246973 A1* | 10/2009 | Clark ............................. | 438/792 |
| 2009/0283825 A1* | 11/2009 | Wang et al. ................... | 257/335 |

(Continued)

FOREIGN PATENT DOCUMENTS

JP 200773800 A * 3/2007 .......... H01L 21/8238

*Primary Examiner* — William F Kraig
*Assistant Examiner* — Joseph C Nicely
(74) *Attorney, Agent, or Firm* — Wade J. Brady, III; Frederick J. Telecky, Jr.

(57) ABSTRACT

An integrated circuit on a (100) substrate containing an n-channel extended drain MOS transistor with drift region current flow oriented in the <100> direction with stressor RESURF trenches in the drift region. The stressor RESURF trenches have stressor elements with more than 100 MPa compressive stress. An integrated circuit on a (100) substrate containing an n-channel extended drain MOS transistor with drift region current flow oriented in the <110> direction with stressor RESURF trenches in the drift region. The stressor RESURF trenches have stressor elements with more than 100 MPa compressive stress. An integrated circuit on a (100) substrate containing a p-channel extended drain MOS transistor with drift region current flow oriented in a <110> direction with stressor RESURF trenches in the drift region. The stressor RESURF trenches have stressor elements with more than 100 MPa tensile stress.

14 Claims, 7 Drawing Sheets

(56) References Cited

U.S. PATENT DOCUMENTS

| | | | |
|---|---|---|---|
| 2010/0144109 A1* | 6/2010 | Park | 438/268 |
| 2010/0148223 A1* | 6/2010 | Jin | 257/255 |
| 2010/0159684 A1* | 6/2010 | Chang et al. | 438/585 |
| 2011/0057271 A1* | 3/2011 | Ito et al. | 257/408 |
| 2012/0058607 A1* | 3/2012 | Parthasarathy et al. | 438/138 |
| 2012/0119293 A1* | 5/2012 | Chu et al. | 257/335 |
| 2012/0133016 A1* | 5/2012 | Kocon | 257/471 |
| 2012/0171842 A1* | 7/2012 | Zhu et al. | 438/424 |
| 2012/0273889 A1* | 11/2012 | Loiko et al. | 257/347 |
| 2013/0045578 A1* | 2/2013 | Bhattacharyya et al. | 438/261 |

\* cited by examiner

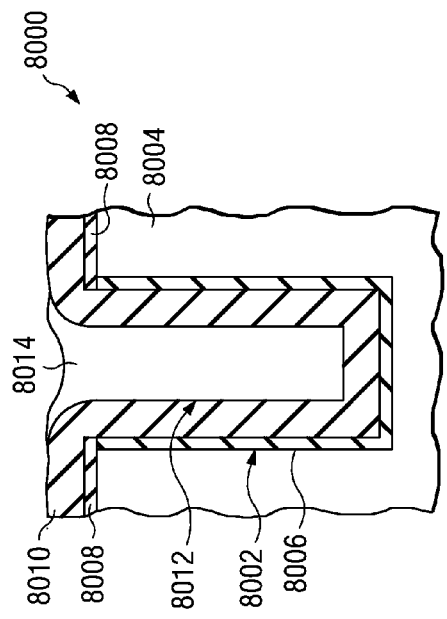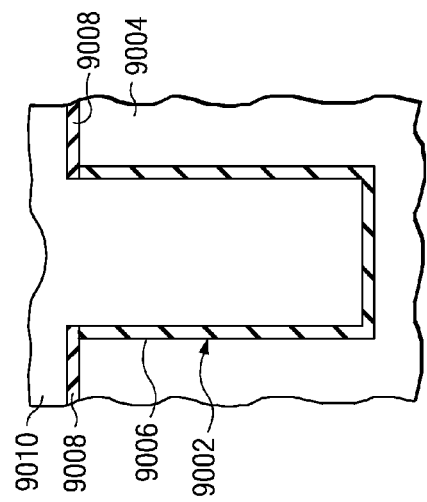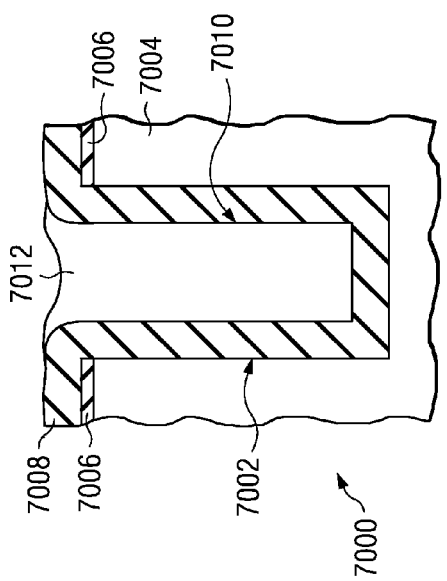

STRAINED LDMOS AND DEMOS

CROSS-REFERENCE TO RELATED APPLICATIONS

This application claims the benefit of priority under U.S.C. §119(e) of U.S. Provisional Application 61/181,465

FIELD OF THE INVENTION

This invention relates to the field of integrated circuits. More particularly, this invention relates to MOS transistors with extended drains in integrated circuits.

BACKGROUND OF THE INVENTION

An integrated circuit may contain an n-channel extended drain metal oxide semiconductor (MOS) transistor, and/or may contain a p-channel extended drain MOS transistor. The extended drain MOS transistor may have a RESURF element abutting a drift region adjacent to the channel region of the extended drain MOS transistor, so that current flow through the drift region is substantially parallel to a boundary between the RESURF element and the drift region that is parallel to a top surface of the integrated circuit substrate. The extended drain MOS transistor may be, for example, a laterally diffused metal oxide semiconductor (LDMOS) transistor, a diffused metal oxide semiconductor (DMOS) transistor or a drain extended metal oxide semiconductor (DEMOS) transistor. Generally, an average doping in the drift region is less than an average doping density in the source region of the extended drain MOS transistor. It may be desirable to reduce an electrical resistance of the drift region so as to increase current through the extended drain MOS transistor.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may contain an n-channel extended drain MOS transistor and/or a p-channel extended drain MOS transistor with one or more stressor RESURF trenches in the drift region of the extended drain MOS transistor. A stressor RESURF trench has a dielectric stressor element to provide stress with desired polarity, compressive or tensile, greater than 100 megapascals (MPa), in a direction parallel to current flow in the drift region. The stressor RESURF trench also has at least one other element, such as a dielectric liner and/or a filler element. A dielectric liner is formed in the stressor RESURF trench before the stressor element, and contacts the drift region. A filler element is formed after the stressor element, and fills a gap in the stressor element. The silicon substrate orientation and the extended drain MOS transistor orientation on the substrate may be chosen to enhance an increase in mobility from the stress. The stressor element may extend over the drift region between adjacent stressor RESURF trenches.

DESCRIPTION OF THE VIEWS OF THE DRAWING

FIG. 7, FIG. 8 and FIG. 9 are cross sections of variations of stressor RESURF trenches formed according to embodiments.

DETAILED DESCRIPTION OF EXAMPLE EMBODIMENTS

Figure 1:
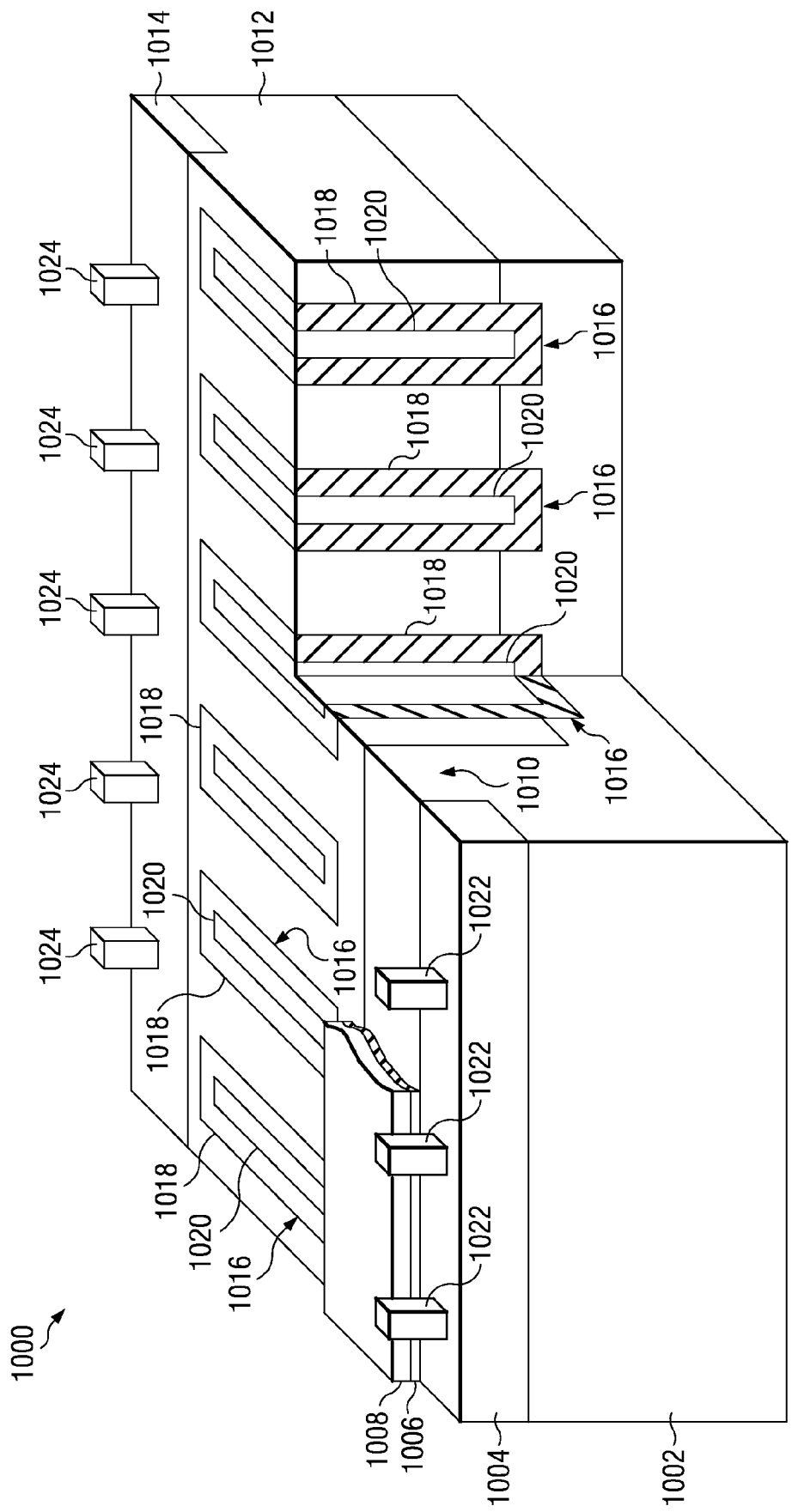
FIG. 1 is a perspective of an integrated circuit containing an n-channel extended drain MOS transistor, formed according to a first embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may contain an n-channel extended drain MOS transistor and/or a p-channel extended drain MOS transistor with one or more stressor RESURF trenches in the drift region of the extended drain. A stressor RESURF trench has a stressor element and a dielectric liner and/or a filler element in the stressor RESURF trench. The dielectric liner, if present, is formed in the stressor RESURF trench before the stressor element, and contacts the drift region. The filler element, if present, may be formed in instances in which the stressor element is conformally formed in the stressor RESURF trench so as to leave a gap in the stressor element. The filler element is formed in the gap in the stressor element. The stressor element is formed in the stressor RESURF trench so as to provide stress on the drift region with a desired polarity, compressive or tensile, greater than 100 MPa, in a direction parallel to current flow the drift region. The stressor element may extend over the drift region between adjacent stressor RESURF trenches. The extended drain p-channel MOS transistor may be, for example, a laterally diffused metal oxide semiconductor (LDMOS) transistor or a drain extended metal oxide semiconductor (DEMOS) transistor. The n-channel MOS transistor may be, for example, a diffused metal oxide semiconductor (DMOS) transistor or a drain extended metal oxide semiconductor (DEMOS) transistor.

A RESURF element provides a surface of an adjacent drift region which reduces a peak electric field in the drift region compared to a similar drift region with no adjacent RESURF element. RESURF elements are described in Appels, et. al., "High Voltage Thin Layer Devices (RESURF devices)" Philips J. Res, 35, pp 1-13, 1980. A RESURF element may have an electrically insulating outer surface, such as silicon dioxide, or may have a semiconductor surface of an opposite polarity compared to the adjacent drift region.

For the purposes of this description, the nomenclature "100 orientation" or "110 oriented" is understood to refer to a crystal orientation of a substrate. The nomenclature "<100> direction" or "<110> direction" is understood to refer to a direction in a plane of a top surface of the substrate.

In a first version of embodiments discussed below, a silicon substrate of the integrated circuit may have a 100 orientation, and an n-channel extended drain MOS transistor may have current flow in a drift region oriented in a <100> direction. Stressor elements of silicon nitride or silicon oxynitride in stressor RESURF trenches in the drift region exert a compressive stress above 100 MPa.

In a second version of embodiments discussed below, a silicon substrate of the integrated circuit may have a 100 orientation, and an n-channel extended drain MOS transistor may have current flow in a drift region oriented in a <110> direction. Stressor elements of silicon nitride or silicon oxynitride in stressor RESURF trenches in the drift region exert a tensile stress above 100 MPa.

In a third version of embodiments discussed below, a silicon substrate of the integrated circuit may have a 100 orientation, and a p-channel extended drain MOS transistor may have current flow in a drift region oriented in a <110> direction. Stressor elements of silicon nitride or silicon oxynitride in stressor RESURF trenches in the drift region exert a tensile stress above 100 MPa.

FIG. 1 is a perspective of an integrated circuit 1000 containing an n-channel extended drain MOS transistor, formed according to a first embodiment. The instant embodiment is described with an n-channel extended drain MOS transistor for exemplary purposes. It will be recognized that a p-channel extended drain MOS transistor may be formed according to the instant embodiment with appropriate changes in polarity of conductivity types. The integrated circuit 1000 is formed in and on a substrate 1002 which may be a single crystal silicon wafer, a silicon-on-insulator (SOI) wafer, a hybrid orientation technology (HOT) wafer with regions of different crystal orientations, or other material appropriate for fabrication of the integrated circuit 1000. The extended drain MOS transistor includes a n-type source region 1004 in the substrate 1002, a gate dielectric layer 1006 on the substrate 1002 adjacent to the source region 1004, a gate 1008 on the gate dielectric layer 1006, a p-type channel region 1010 in the substrate 1002 under the gate dielectric layer 1006 abutting the source region 1004, an n-type drift region 1012 in the substrate 1002 abutting the channel region 1010 and opposite the source region 1004. The drift region 1012 abuts an n-type drain diffused contact region 1014.

Stressor RESURF trenches 1016 are formed in the drift region 1012, possibly extending through a bottom surface of the drift region 1012 into the substrate 1002 as depicted in FIG. 1. The stressor RESURF trenches 1016 may be separated by distances between 200 nanometers and 2 microns. In the instant embodiment, the stressor RESURF trenches 1016 do not extend into the channel region 1010 or into the drain diffused contact region 1014. In a version of the instant embodiment depicted in FIG. 1, a stressor element 1018 is formed in each stressor RESURF trench 1016; the stressor element 1018 contacts the drift region 1012. The stressor element 1018 has a compressive or tensile stress greater than 100 MPa. The stressor element 1018 may include one or more layers of silicon nitride and/or silicon oxynitride. The stressor element 1018 may be formed, for example, by deposition methods such as atomic layer deposition (ALD) or chemical vapor deposition (CVD), plasma enhanced chemical vapor deposition (PECVD), low pressure chemical vapor deposition (LPCVD), atmospheric pressure chemical vapor deposition (APCVD), or other process. In the version of the instant embodiment depicted in FIG. 1, the stressor element 1018 does not completely fill the stressor RESURF trench 1016, so that a gap is present in the stressor element 1018. A filler element 1020 is formed in each stressor RESURF trench 1016 on the stressor element 1018 in the gap of the stressor element 1018. The filler element 1020 may include silicon dioxide, polycrystalline silicon, referred to herein as polysilicon, or other dielectric or semiconducting material. The filler element 1020 may be formed, for example, by ALD, CVD, PECVD, LPCVD, APCVD, or other process.

An optional field oxide element, not shown, may be formed over the drift region 1012 at the drain diffused contact region 1014. The field oxide element may be formed prior to, or after, formation of the stressor RESURF trenches 1016. Source contacts 1022 are formed on the source region 1004 to provide electrical connection to a source bias potential, not shown, in the integrated circuit 1000. Drain contacts 1024 are formed on the drain diffused contact region 1014 to provide electrical connection to a drain bias potential, not shown, in the integrated circuit 1000. Other RESURF trenches, not shown, lacking stressor elements, may also be formed in the drift region 1012.

Other versions of the instant embodiment with other configurations of the stressor RESURF trenches 1016 are within the scope of the instant embodiment. For example, in another version, the stressor RESURF trenches 1016 may include a dielectric liner.

Figure 2:
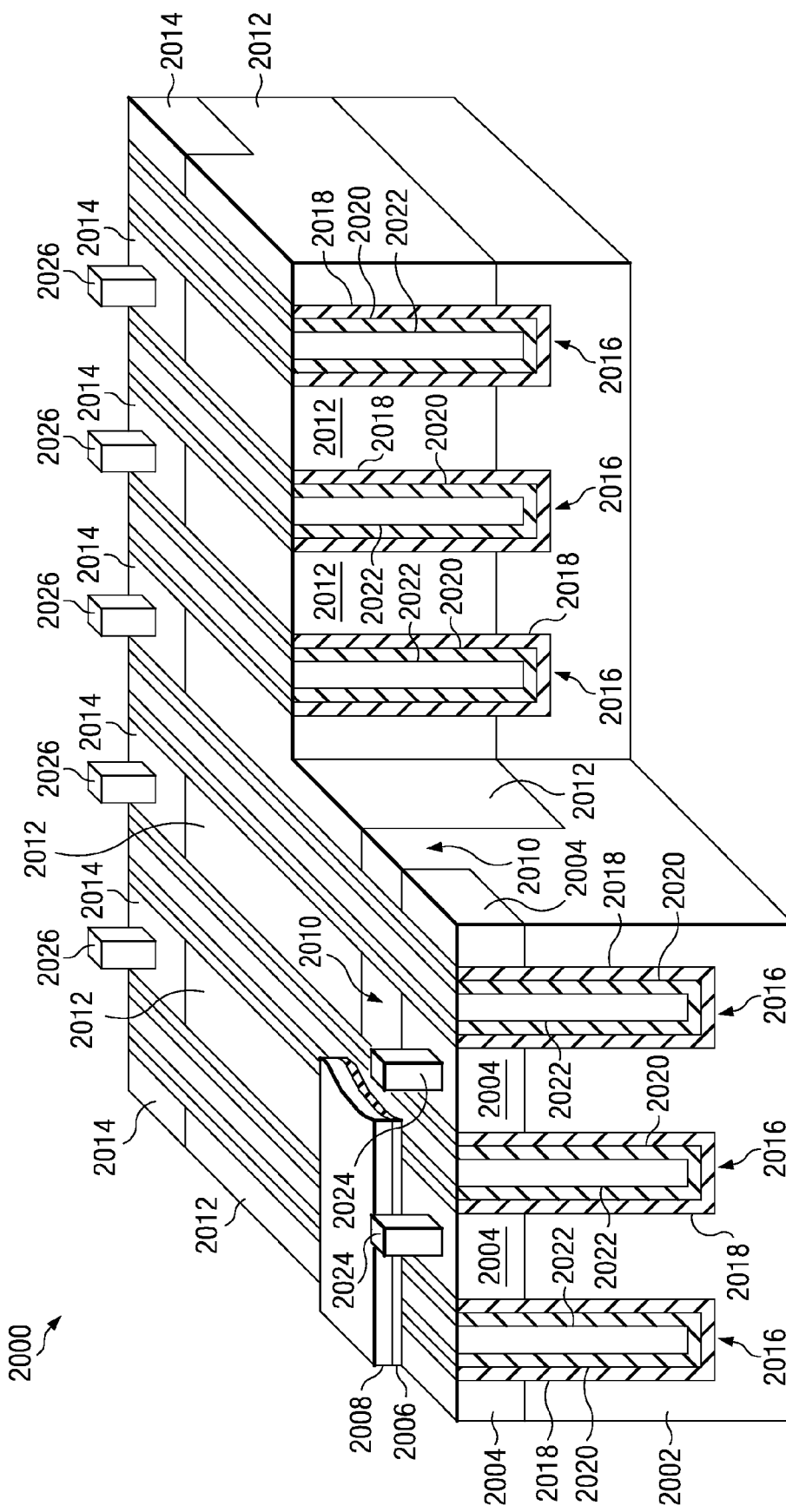
FIG. 2 is a perspective of an integrated circuit containing an n-channel extended drain MOS transistor, formed according to a second embodiment.

FIG. 2 is a perspective of an integrated circuit 2000 containing an re-channel extended drain MOS transistor, formed according to a second embodiment. The instant embodiment is described with an n-channel extended drain MOS transistor for exemplary purposes. It will be recognized that a p-channel extended drain MOS transistor may be formed according to the instant embodiment with appropriate changes in polarity of conductivity types. The integrated circuit 2000 is formed in and on a substrate 2002 having the materials and properties described in reference to FIG. 1. The extended drain MOS transistor includes a n-type source region 2004 in the substrate 2002, a gate dielectric layer 2006 on the substrate 2002 adjacent to the source region 2004, a gate 2008 on the gate dielectric layer 2006, a p-type channel region 2010 in the substrate 2002 under the gate dielectric layer 2006 abutting the source region 2004, an n-type drift region 2012 in the substrate 2002 abutting the channel region 2010 and opposite the source region 2004. The drift region 2012 abuts an n-type drain diffused contact region 2014.

Stressor RESURF trenches 2016 are formed in the substrate 2002 laterally extending through the channel region 2010 and through the source region 2004 and through the drain diffused contact region 2014, and possibly extending through a bottom surface of the drift region 2012 into the substrate 2002 as depicted in FIG. 2. The stressor RESURF trenches 2016 may be separated by distances between 200 nanometers and 2 microns. In a version of the instant embodiment depicted in FIG. 2, a dielectric liner 2018 is formed in each stressor RESURF trench 2016 so that the dielectric liner 2018 contacts the drift region 2012. The dielectric liner 2018 may be, for example, silicon dioxide, formed by thermal oxidation of semiconductor material at an interior surface of the each stressor RESURF trenches 2016, by deposition methods such as ALD or CVD, or other process. A stressor element 2020 is formed in each stressor RESURF trench 2016 on the dielectric liner 2018 as described in reference to FIG. 1. The stressor element 2020 has a compressive or tensile stress greater than 100 MPa. In the version of the instant embodiment depicted in FIG. 2, the stressor element 2020 is formed conformally on the dielectric liner 2018 so as to leave a gap in the stressor element 2020. A filler element 2022 is formed in each stressor RESURF trench 2016 on the stressor element 2020 in the gap of the stressor element 2020. The filler element may be formed, for example, of polysilicon, by thermally decomposing SiH4 gas inside a low-pressure reactor at a temperature between 580° C. to 650° C.

An optional field oxide element, not shown, may be formed over the drift region 2012 at the drain diffused contact region 2014. Source contacts 2024 are formed on the source region 2004 to provide electrical connection to a source bias potential, not shown, in the integrated circuit 2000. Drain contacts 2026 are formed on the drain diffused contact region 2014 to provide electrical connection to a drain bias potential, not shown, in the integrated circuit 2000. Other RESURF trenches, not shown, lacking stressor elements, may also be formed in the drift region 2012.

Other versions of the instant embodiment with other configurations of the stressor RESURF trenches 2016 are within the scope of the instant embodiment. For example, in another version, the stressor RESURF trenches 2016 may have no filler element.

Figure 3:
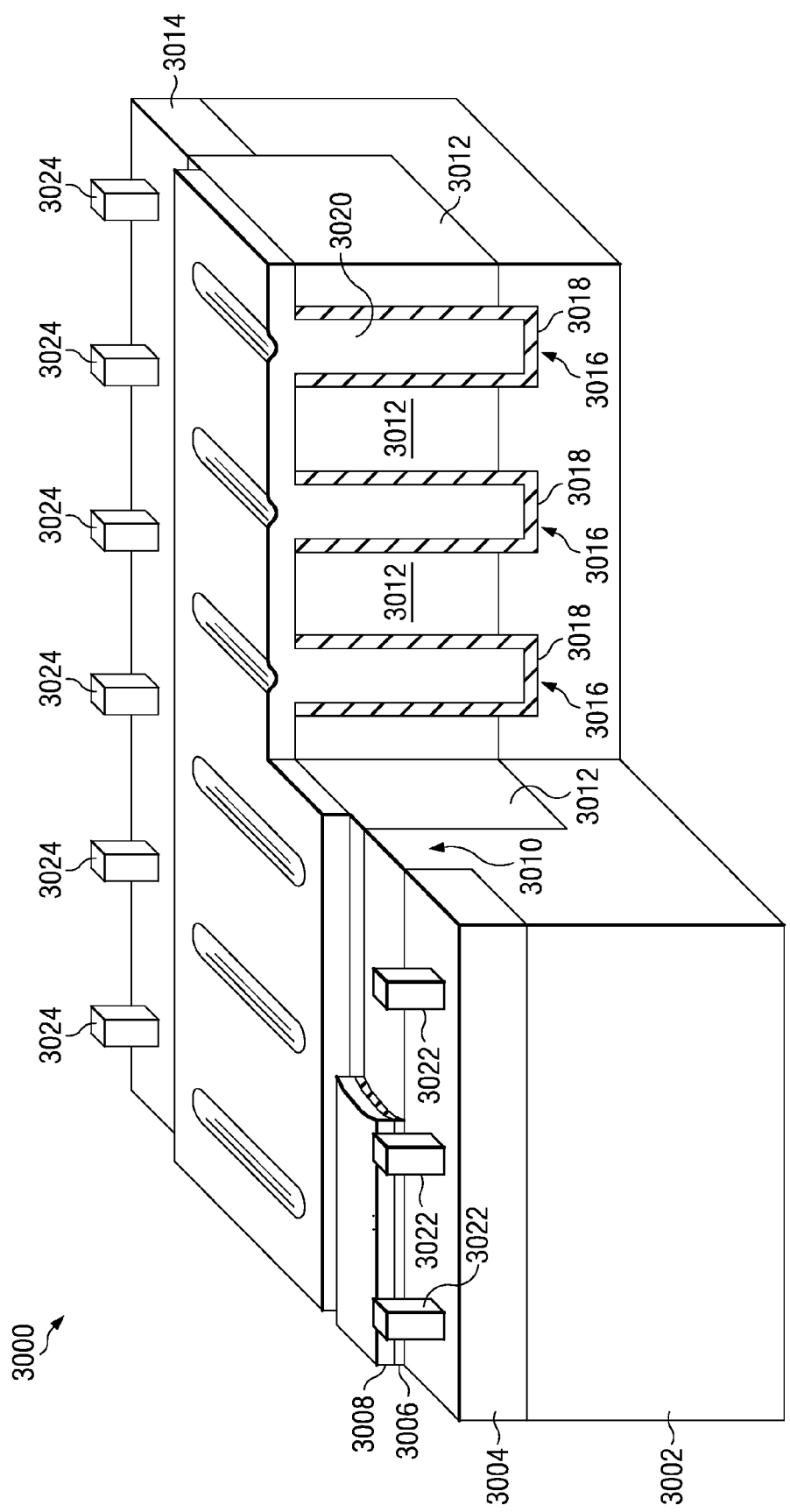
FIG. 3 is a perspective of an integrated circuit containing an n-channel extended drain MOS transistor, formed according to a third embodiment.

FIG. 3 is a perspective of an integrated circuit 3000 containing an re-channel extended drain MOS transistor, formed according to a third embodiment. The instant embodiment is described with an n-channel extended drain MOS transistor for exemplary purposes. It will be recognized that a p-channel extended drain MOS transistor may be formed according to the instant embodiment with appropriate changes in polarity of conductivity types. The integrated circuit 3000 is formed in and on a substrate 3002 having the materials and properties described in reference to FIG. 1. The extended drain MOS transistor includes a n-type source region 3004 in the substrate 3002, a gate dielectric layer 3006 on the substrate 3002 adjacent to the source region 3004, a gate 3008 on the gate dielectric layer 3006, a p-type channel region 3010 in the substrate 3002 under the gate dielectric layer 3006 abutting the source region 3004, an n-type drift region 3012 in the substrate 3002 abutting the channel region 3010 and opposite the source region 3004. The drift region 3012 abuts an n-type drain diffused contact region 3014.

Stressor RESURF trenches 3016 are formed in the substrate 3002, possibly extending through a bottom surface of the drift region 3012 into the substrate 3002 as depicted in FIG. 3. In one version of the instant embodiment, depicted in FIG. 3, the stressor RESURF trenches 3016 may not extend into the channel region 3010 or into the drain diffused contact region 3014. In another version, the stressor RESURF trenches 3016 may laterally extend through the channel region 3010 and the source region 3004 and/or through the drain diffused contact region 3014. The stressor RESURF trenches 3016 may be separated by distances between 200 nanometers and 2 microns. A dielectric liner 3018 is formed in each stressor RESURF trench 3016 as described in reference to FIG. 1 so that the dielectric liner 3018 contacts the drift region 3012. Stressor elements 3020 are formed in each stressor RESURF trench 3016 on the dielectric liner 3018 as described in reference to FIG. 1, and extending over a top surface of the drift region 3012. The stressor element 3020 has a compressive or tensile stress greater than 100 MPa.

An optional field oxide element, not shown, may be formed over the drift region 3012 at the drain diffused contact region 3014. Source contacts 3022 are formed on the source region 3004 to provide electrical connection to a source bias potential, not shown, in the integrated circuit 3000. Drain contacts 3024 are formed on the drain diffused contact region 3014 to provide electrical connection to a drain bias potential, not shown, in the integrated circuit 3000. Other RESURF trenches, not shown, lacking stressor elements, may also be formed in the drift region 3012.

Figure 5:
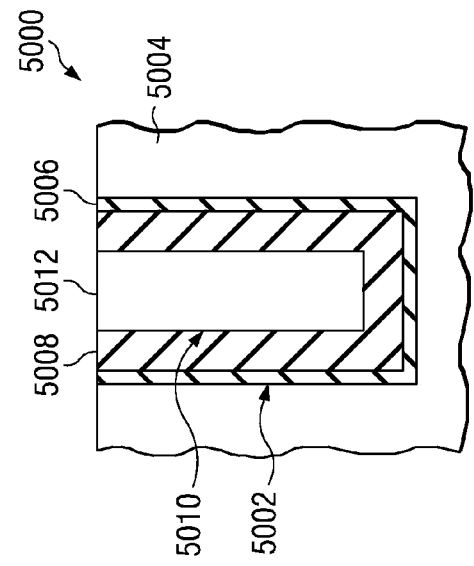
FIG. 4, FIG. 5 and FIG. 6 are cross sections of variations of stressor RESURF trenches formed according to embodiments.
Figure 6:
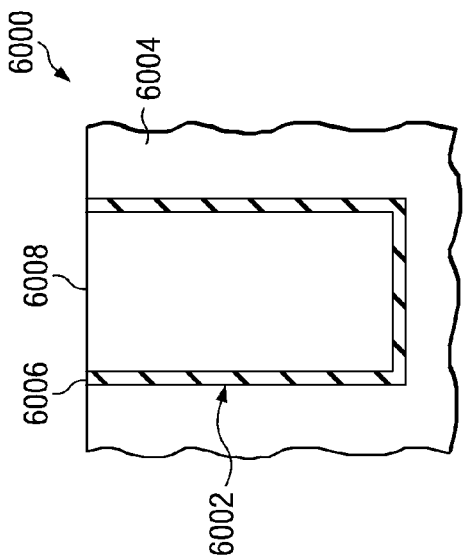
Figure 4:
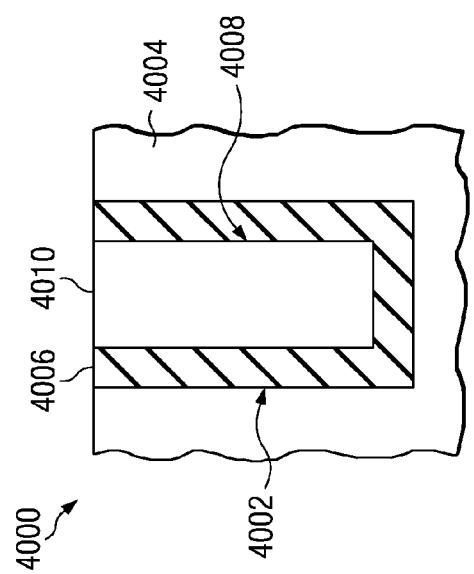

FIG. 4, FIG. 5 and FIG. 6 are cross sections of variations of stressor RESURF trenches formed according to embodiments. The stressor RESURF trenches depicted in FIG. 4, FIG. 5 and FIG. 6 may be used in the extended drain MOS transistors discussed in reference to FIG. 1 and FIG. 2. Referring to FIG. 4, the integrated circuit 4000 has a stressor RESURF trench 4002 in a drift region 4004 of an extended drain MOS transistor. A stressor element 4006 is conformally formed in the stressor RESURF trench 4002, for example as described in reference to FIG. 1, so as to leave a gap 4008 in the stressor element 4006. A filler element 4010 is formed in the gap 4008. The filler element 4010 may fill the gap 4008, as depicted in FIG. 4, or may leave a cavity, not shown.

Referring to FIG. 5, the integrated circuit 5000 has a stressor RESURF trench 5002 in a drift region 5004 of an extended drain MOS transistor. A dielectric liner 5006 is formed in the stressor RESURF trench 5002 as described in reference to FIG. 2. A stressor element 5008 is conformally formed in the stressor RESURF trench 5002 on the dielectric liner 5006, for example as described in reference to FIG. 2, leaving a gap 5010 in the stressor element 5008. A filler element 5012 is formed in the gap 5010. The filler element 5012 may fill the gap 5010, as depicted in FIG. 5, or may leave a cavity, not shown.

Referring to FIG. 6, the integrated circuit 6000 has a stressor RESURF trench 6002 in a drift region 6004 of an extended drain MOS transistor. A dielectric liner 6006 is formed in the stressor RESURF trench 6002 as described in reference to FIG. 2. A stressor element 6008 is formed in the stressor RESURF trench 6002 on the dielectric liner 6006, so as to fill the stressor RESURF trench 6002. The stressor element 6008 may be formed using the materials and processes described in reference to FIG. 1.

FIG. 7, FIG. 8 and FIG. 9 are cross sections of variations of stressor RESURF trenches formed according to embodiments. The stressor RESURF trenches depicted in FIG. 7, FIG. 8 and FIG. 9 may be used in the extended drain MOS transistors discussed in reference to FIG. 3. Referring to FIG. 7, the integrated circuit 7000 has a stressor RESURF trench 7002 in a drift region 7004 of an extended drain MOS transistor. An optional top dielectric layer 7006 may be formed on a top surface of the drift region 7004. A stressor element 7008 is conformally formed in the stressor RESURF trench 7002 and over the adjacent drift region 7004. The stressor element 7008 may be formed using the materials and processes described in reference to FIG. 1. The stressor element 7008 is formed so as to leave a gap 7010 in the stressor element 7008. A filler element 7012 is formed in the gap 7010. The filler element 7012 may fill the gap 7010, as depicted in FIG. 7, or may leave a cavity, not shown.

Referring to FIG. 8, the integrated circuit 8000 has a stressor RESURF trench 8002 in a drift region 8004 of an extended drain MOS transistor. A dielectric liner 8006 is formed in the stressor RESURF trench 8002 as described in reference to FIG. 2. An optional top dielectric layer 8008 may be formed on a top surface of the drift region 8004. The top dielectric layer 8008 may be formed concurrently with the dielectric liner 8006, or may be formed separately. A stressor element 8010 is conformally formed in the stressor RESURF trench 8002 on the dielectric liner 8006 and over the adjacent drift region 8004. The stressor element 8010 may be formed using the materials and processes described in reference to FIG. 1. The stressor element 8010 is formed so as to leave a gap 8012 in the stressor element 8010. A filler element 8014 is formed in the gap 8012. The filler element 8014 may fill the gap 8012, as depicted in FIG. 8, or may leave a cavity, not shown.

Referring to FIG. 9, the integrated circuit 9000 has a stressor RESURF trench 9002 in a drift region 9004 of an extended drain MOS transistor. A dielectric liner 9006 is formed in the stressor RESURF trench 9002 as described in reference to FIG. 2. An optional top dielectric layer 9008 may be formed on a top surface of the drift region 9004, as described in reference to FIG. 8. A stressor element 9010 is formed in the stressor RESURF trench 9002 on the dielectric liner 9006 and over the adjacent drift region 9004, so as to fill the stressor RESURF trench 9002. The stressor element 9008 may be formed using the materials and processes described in reference to FIG. 1.

Figure 11:
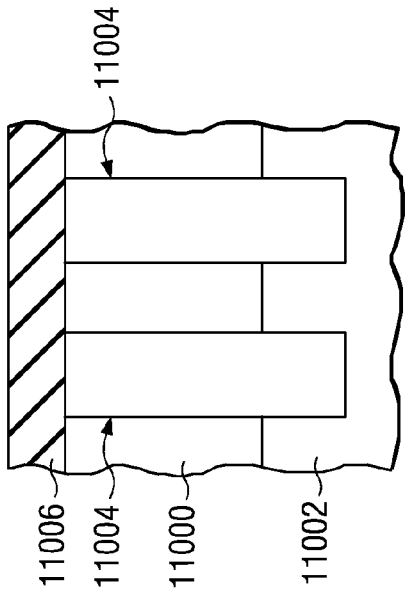
FIG. 10, FIG. 11 and FIG. 12 are cross sections of variations of stressor RESURF trenches formed according to embodiments.
Figure 12:
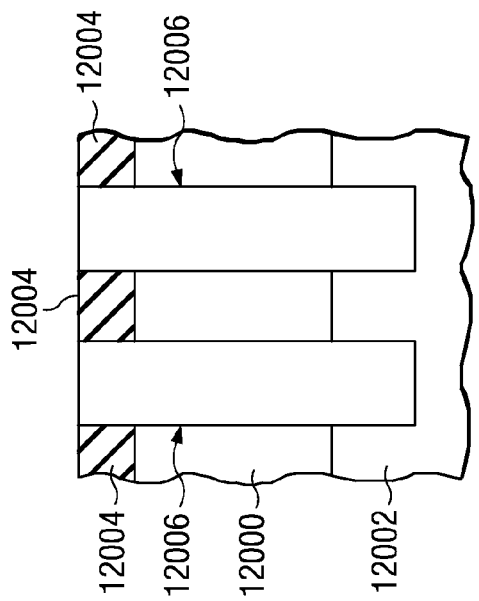
Figure 10:
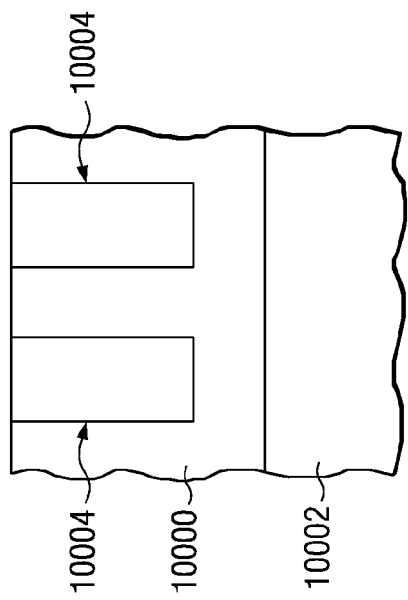

FIG. 10, FIG. 11 and FIG. 12 are cross sections of variations of stressor RESURF trenches formed according to embodiments. The stressor RESURF trenches depicted in FIG. 10, FIG. 11 and FIG. 12 may be used in the extended drain MOS transistors discussed in reference to FIG. 1, FIG. 2 and FIG. 3. Referring to FIG. 10, a drift region 10000 is formed in a substrate 10002. Stressor RESURF trenches 10004 are formed in the drift region 10000 so that bottom surfaces of the stressor RESURF trenches 10004 do not extend through a bottom surface of the drift region 10000.

Referring to FIG. 11, a drift region 11000 is formed in a substrate 11002. Stressor RESURF trenches 11004 are formed in the drift region 11000. The stressor RESURF trenches 11004 may extend through a bottom surface of the drift region 11000 as depicted in FIG. 11, or may be shallower than the drift region 11000, as depicted in FIG. 10. After formation of the stressor RESURF trenches 11004, field oxide 11006 is formed on the drift region 11000 and over the stressor RESURF trenches 11004. The field oxide 11006 may cover a portion, or all, of the drift region 11000.

Referring to FIG. 12, a drift region 12000 is formed in a substrate 12002. Field oxide 12004 is formed on the drift region 12000. The field oxide 12004 may cover a portion, or all, of the drift region 12000. After formation of the field oxide 12004, stressor RESURF trenches 12006 are formed through the field oxide 12004 and in the drift region 12000. The stressor RESURF trenches 12006 may extend through a bottom surface of the drift region 12000 as depicted in FIG. 12, or may be shallower than the drift region 12000, as depicted in FIG. 10.

Figure 14:
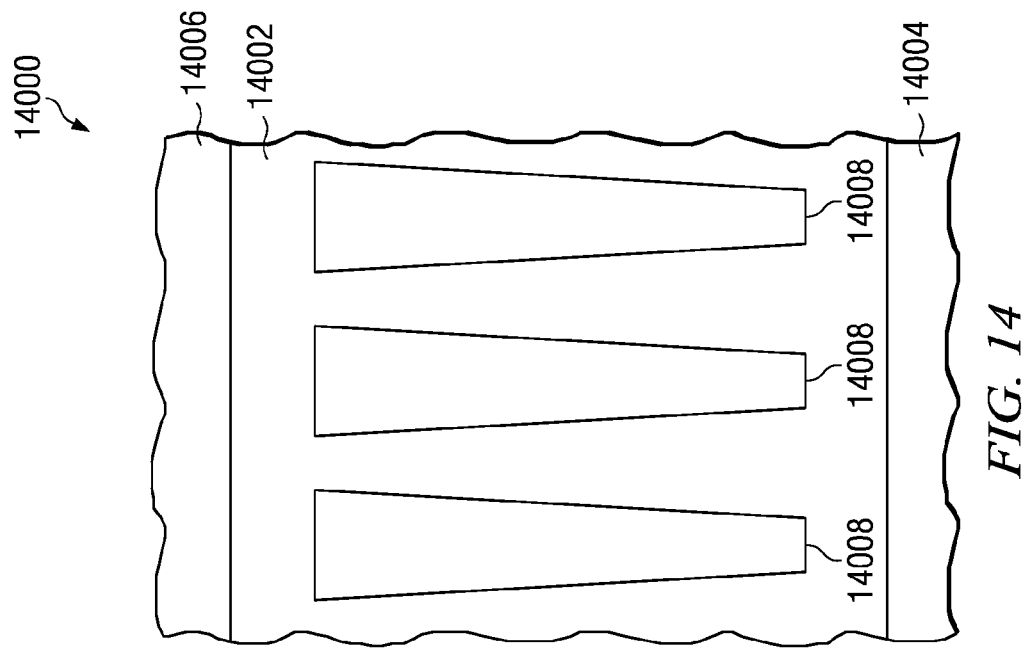
FIG. 13 and FIG. 14 are top views of variations of stressor RESURF trenches formed according to embodiments.
Figure 13:
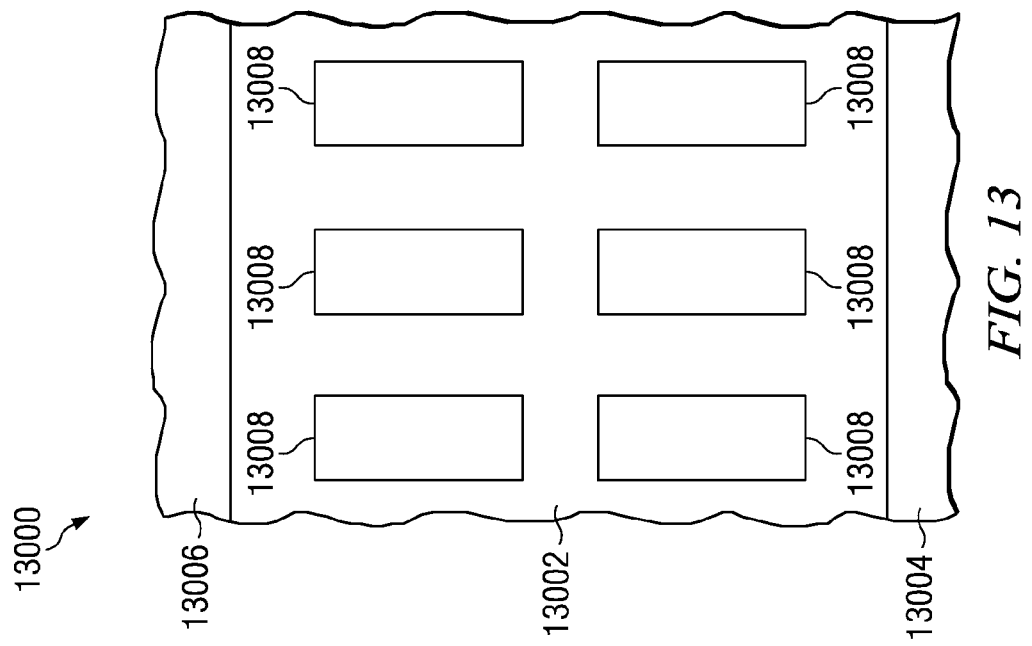

FIG. 13 and FIG. 14 are top views of variations of stressor RESURF trenches formed according to embodiments. The stressor RESURF trenches depicted in FIG. 10, FIG. 11 and FIG. 12 may be used in the extended drain MOS transistors discussed in reference to FIG. 1, FIG. 2 and FIG. 3. Referring to FIG. 13, an integrated circuit 13000 has an extended drain MOS transistor which includes a drift region 13002 between a channel region 13004 and a drain diffused contact region 13006. Two or more rows of stressor RESURF trenches 13008 are formed in the drift region 13002.

Referring to FIG. 14, an integrated circuit 14000 has an extended drain MOS transistor which includes a drift region 14002 between a channel region 14004 and a drain diffused contact region 14006. Stressor RESURF trenches 14008 are formed in the drift region 14002 in a tapered configuration, so that a wide end of each stressor RESURF trench 14008 is at least 20 percent wider than a narrow end of each stressor RESURF trench 14008. In one version of the instant embodiment, wide ends of the tapered stressor RESURF trenches 14008 may be adjacent to the drain diffused contact region 14006 and narrow ends of the tapered stressor RESURF trenches 14008 may be adjacent to the channel region 14004, as depicted in FIG. 14. In another version, wide ends of the tapered stressor RESURF trenches 14008 may be adjacent to the channel region 14004 and narrow ends of the tapered stressor RESURF trenches 14008 may be adjacent to the drain diffused contact region 14006.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit containing an extended drain metal oxide semiconductor (MOS) transistor, comprising:
   a substrate, said substrate having a first conductivity type;
   a drain diffused contact region at a top surface of said substrate, said drain diffused contact region having a second conductivity type opposite from said first conductivity type;
   a source region at said top surface of said substrate, said source region having said second conductivity type;
   a drift region of said extended drain MOS transistor, said drift region being located in said substrate, in which said drift region has said second conductivity type;
   stressor Reduced Surface Field RESURF trenches formed in said drift region, extending through a bottom surface of said drift region into said substrate, said stressor RESURF trenches being separated by distances between 200 nanometers and 2 microns, in which said stressor RESURF trenches include:
      stressor elements in said stressor RESURF trenches, so that said stressor elements have stress greater than 100 megapascals (MPa); and
      at least one of:
         dielectric liners in said stressor RESURF trenches contacting said drift region, so that said stressor elements are located on said dielectric liners; and
         filler elements in gaps of said stressor elements.

2. The integrated circuit of claim 1, in which said stressor elements have compressive stress.

3. The integrated circuit of claim 1, in which said stressor elements have tensile stress.

4. The integrated circuit of claim 1, in which said stressor RESURF trenches are configured in at least two rows in said drift region.

5. An integrated circuit containing an n-channel extended drain MOS transistor, comprising:
   a p-type silicon substrate, said substrate having a (100) orientation;
   an n-type drain diffused contact region at a top surface of said substrate;
   an n-type source region at said top surface of said substrate;
   an n-type drift region of said extended drain MOS transistor, said drift region being located in said substrate;
   stressor Reduced Surface Field RESURF trenches formed in said drift region extending through a bottom surface of said drift region into substrate, said stressor RESURF trenches being separated by distances between 200 nanometers and 2 microns, in which said stressor RESURF trenches include:

stressor elements in said stressor RESURF trenches, so that said stressor elements have compressive stress greater than 100 megapascals (MPa); and at least one of:

dielectric liners in said stressor RESURF trenches contacting said drift region, so that said stressor elements are located on said dielectric liners; and filler elements in gaps of said stressor elements.

6. The integrated circuit of claim 5, in which said drift region is oriented so that current flow in said drift region is oriented in a <100> direction.

7. The integrated circuit of claim 5, in which said drift region is oriented so that current flow in said drift region is oriented in a <110> direction.

8. The integrated circuit of claim 5, further including field oxide formed over said drift region.

9. The integrated circuit of claim 5, in which said stressor elements are formed of silicon oxynitride.

10. The integrated circuit of claim 5, in which said stressor elements are formed of silicon nitride.

11. An integrated circuit containing a p-channel extended drain MOS transistor, comprising:

an n-type silicon substrate, said substrate having a (100) orientation;

a p-type drain diffused contact region at a top surface of said substrate;

a p-type source region at said top surface of said substrate;

a p-type drift region of said extended drain MOS transistor, said drift region being located in said substrate, so that current flow in said drift region is oriented in a <110> direction;

stressor Reduced Surface Field RESURF trenches formed in said drift region extending through a bottom surface of said drift region into said substrate, said stressor RESURF trenches being separated by distances between 200 nanometers and 2 microns, in which said stressor RESURF trenches include:

stressor elements in said stressor RESURF trenches, so that said stressor elements have tensile stress greater than 100 megapascals (MPa); and at least one of:

dielectric liners in said stressor RESURF trenches contacting said drift region, so that said stressor elements are located on said dielectric liners; and filler elements in gaps of said stressor elements.

12. The integrated circuit of claim 11, in which said stressor RESURF trenches do not extend into a channel region of said extended drain MOS transistor, and do not extend into a drain diffused contact region of said extended drain MOS transistor.

13. The integrated circuit of claim 11, further including field oxide formed over said drift region.

14. The integrated circuit of claim 11, in which said stressor elements are formed of silicon nitride.

* * * * *